United States Patent [19]

Antonetti et al.

[11] 4,153,107
[45] May 8, 1979

[54] TEMPERATURE EQUALIZING ELEMENT FOR A CONDUCTION COOLING MODULE

[75] Inventors: Vincent W. Antonetti; Omkarath R. Gupta, both of Poughkeepsie, N.Y.

[73] Assignee: International Business Machines Corporation, Armonk, N.Y.

[21] Appl. No.: 811,740

[22] Filed: Jun. 30, 1977

[51] Int. Cl.$^2$ ............................................. F28F 7/00
[52] U.S. Cl. ..................................... 165/185; 357/81; 357/82
[58] Field of Search .................. 165/80, 185, DIG. 7, 165/80 B–80 E; 174/16 HS; 357/81, 82; 361/382–386, 389

[56] References Cited
U.S. PATENT DOCUMENTS

| | | | |
|---|---|---|---|
| 3,536,892 | 10/1970 | Walther et al. | 165/185 |
| 3,545,535 | 10/1968 | Hinkens | 165/80 |
| 3,993,123 | 11/1976 | Chu et al. | 357/82 |

*Primary Examiner*—Sheldon J. Richter
*Attorney, Agent, or Firm*—Harold H. Sweeney, Jr.

[57] ABSTRACT

A thermal conduction element having a predetermined diminished diameter portion of a predetermined length along the length of the thermal conduction element is provided within each of the housing member openings located opposite the low-power components in a conduction cooling module. The thermal conduction elements and housing form part of a heat transfer path for removing heat from electronic components to be cooled. The thermal conduction elements and the interfaces associated therewith provide an increased thermal resistance, thereby, increasing the heat transfer path thermal resistance to prevent the low-power electronic components from being cooled below the lower temperature limit and allowing them to operate at a higher temperature.

6 Claims, 3 Drawing Figures

4,153,107

TEMPERATURE EQUALIZING ELEMENT FOR A CONDUCTION COOLING MODULE

BACKGROUND OF THE INVENTION

1. Statement of the Invention

The invention relates to a thermal conduction element for increasing the thermal resistance of the thermal path associated with a low-power electronic component, and more particularly, to a thermal conduction element which is customized to increase the thermal resistance in the cooling path of a low-power electronic component so as to maintain the operation of the low-power component at a higher temperature.

2. Description of the Prior Art

U.S. Pat. No. 3,993,123, filed Oct. 28, 1975 and issued Nov. 23, 1976, shows an example of an encapsulated cooling unit for one or more heat generating components mounted on a substrate. A heat conduction cap or housing is sealed to the substrate enclosing the heat generating components. The wall of the housing opposite the substrate contains elongated openings therein extending towards the heat generating components and on the same centers with respect thereto. A resilient member is located in the housing in communion with the inner end of the openings. A thermal conduction element is located in each of the openings forming a small peripheral gap between each opening wall and the associated thermal conduction element. The resilient member urges the thermal conduction elements into pressure contact with the heat generating components. A thermal conductive inert fluid is located within the cap or housing filling the peripheral gaps and the interfaces between the heat generating elements and the thermal conduction elements. The heat is removed from the housing by external heat removal means.

This conduction cooling scheme is very efficient and keeps the electronic components to be cooled operating within their specific thermal limits. However, when low-power components are included with the high-power components within the same module or all low-power components are utilized, the direct conduction cooling module is too efficient for the low-power electronic components. That is, the low-power electronic components are essentially over-cooled. A long time is required for these low-power components to reach operating temperature or they are maintained below their minimum operating temperature limit.

SUMMARY OF THE INVENTION

A low-power electronic component to be cooled or at least one low-power electronic component and higher-power electronic components are located in a conduction cooling module of the type having a conduction heat transfer path for removing heat therefrom. A housing member is included in the heat transfer path which has openings therein, one opposite each of the electronic components to be cooled. A thermal conduction element is located in each of the the housing member openings. The thermal conduction elements located in said housing member openings located opposite the low-power electronic components have a predetermined diminished diameter portion of a predetermined length along the length of said thermal conduction element. Resilient means are included which urge said thermal conduction elements against the electronic components to be cooled.

The diminished diameter portion of the thermal conduction element provides an increased resistance in the cooling path and thus provides for the increased temperature operation of the low-power electronic component to be cooled.

It is the main object of the present invention to provide a thermal conduction element, for use in the heat transfer path of low-power electronic components to be cooled, which cause an increase in the thermal resistance of the path, thereby increasing the operating temperature of the low-power electronic components to be cooled above their minimum thermal operating limit.

It is another object of the present invention to provide a thermal conduction element located in each of the housing member openings located opposite a low-power electronic component to be cooled, which has a predetermined diminished diameter portion of a predetermined length along the length of the thermal conduction element, whereby a higher thermal resistance is provided in the cooling path of the low-power electronic component.

The foregoing and other objects, features and advantages of the invention will be apparent from the following more particular description of preferred embodiments of the invention as illustrated in the accompanying drawings.

DESCRIPTION OF THE PREFERRED EMBODIMENT

Figure 1:
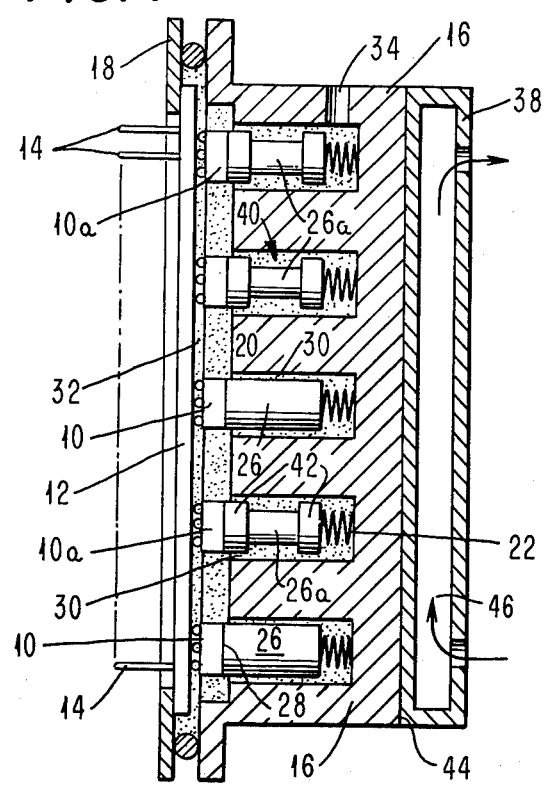
FIG. 1 is a partially schematic cross-sectional view of a thermal cooling module which includes several customized thermal conduction elements in the heat path of low-power electronic components.

Referring to FIG. 1, there is shown a cross-sectional view of a gas encapsulated module for providing cooling of electronic components shown in the form of chips 10 to be cooled. As is well known, the chip 10 consists of solid state circuits and devices which are densely packed on each chip. The power dissipated in the circuits within the chip generates heat which must be removed from the chip. Since the various circuits have different power requirements, and since the integrated components thereon must be maintained within certain temperature ranges for reliable operation, the cooling must be of such character as to maintain the chip temperature within the required operating range.

The chips 10 are mounted on one side of a substrate 12, generally made of ceramic, which has pins 14 extending from the other side thereof. These connecting pins 14 provide for the plugging of a module into a board (not shown) which may very well carry auxiliary circuits, etc. A housing or cap 16 is attached to substrate 12 by means of a flange 18 which extends from the periphery of the substrate 12. The cap 16 is made of a good heat conductive material such as copper or aluminum. The cap 16 is sufficiently thick to provide openings 20 opposite each of the closely spaced chips 10. Springs 22 are located at the inner end of each of the openings 20 and provide a spring force against a thermal conduction or piston element 26 located in the opening 20. The spring force gives the piston element 26 a predetermined force at the outer end thereof where it contacts the back surface of the electronic chip 10 to be cooled. A small gap 30 exists between the circumference of the solid piston element 26 and the side walls of the hole 20 in the cap 16. The gap 30 is sufficiently wide to allow a little play of the element 26 within the hole 20 so that the element 26 can attain relatively flat surface engagement with the chip 10. It should also be appreciated that the thermal conductive piston element 26 is adaptable to chips 10 of various heights because of the resiliency of the spring member 22. Helium gas 32 is introduced into the open space between the substrate 12 and the cap 16. Helium gas is utilized for several reasons. The gas has a low molecular weight and thus easily fills the voids in the interface 28 between the thermal conductive piston elements 26 and chips 10. Likewise, the helium gas 32 fills the gap 30 between the periphery of the thermal conductive piston element 26 and the wall of the hole 20 thus forming a gaseous thermal conductive interface. Another feature of the gas is that it is a good thermal conductor and, therefore, forms an interface having high heat conductivity. That is, the interfaces formed using helium gas have a relatively low thermal resistance. Another feature of the gas which is very important is that it is inert. By inert it is meant that the gas is electrically non-conductive, non-poisonous, non-corrosive, non-flammable, non-explosive and non-toxic. The gas also has a high adhesion quality that essentially wets the surface which it is in contact with. Other low-molecular weight gases such as hydrogen or carbon dioxide could be used. Thus, the pressure interface 28 containing a thermal conductive inert gas in the voids provides a low-resistance to the heat transfer and, accordingly, provides a high heat conductive interface. The gap 30 around the periphery of the thermal conduction elements 26 containing the helium gases previously mentioned also provides a good thermal interface. Thus, the module must be designed to obtain the required heat transfer rate to maintain the chip 10 within its required operating range. The heat accumulated in the thermal conductive material housing 16 from each of the thermal conductive elements 26 is transferred to a cold plate 38 which is attached to the cap 16. As can be seen from FIG. 1, the cap 16's surface is relatively flat so that the cold plate 38 can be attached thereto with good thermal conductive relation. The cold plate 38 has a cooling liquid 46 circulated therethrough which removes the heat transferred to the cold plate.

The module is not limited to the cold plate 38 type of exterior heat removal, and in fact could employ an air-cooled heat sink as well. Thus, the heat transfer path for removing heat from the heat generating electronic component chips 10 is across the interface 28 between the chips 10 and the piston conductive elements 26, through the piston conduction elements 26 and across the interface 30 between the circumference of these elements and the walls of the openings 20 within the cap 16. The heat is then conveyed through the cap 16 and through the interface between the top of the cap 16 and the wall of the cold plate 38. The heat moves through the wall of the cold plate 38 into the liquid 46 which flows through the cold plate 38 which is the ultimate heat sink. As can be seen, the rate of heat removal must be such as to keep the electronic components or chips 10 within their thermal operating range. It has been found that low-power chips, that is, those chips which do not generate sufficient heat are subject to the good thermal heat transfer path and, consequently, are maintained below their specified minimum operating temperature limit. This problem is solved by the present invention by including customized thermal conduction elements 26a in the openings 20 in the housing 16 opposite low-power electronic components 10a to be cooled. The customizing consists of diminishing the diameter of a portion of the conduction cooling element or piston. This diminished diameter portion 40 extends along a predetermined length of the thermal conduction element 26a, and the cutout portion of the thermal conduction element or the diminished diameter thereof may be located symmetrically about the center of the length of the element. However, in the case of extremely low-power chips 10a the diminished diameter portion 40 can start at the end of the thermal conduction element 26a which abuts the chip 10a. This diminishes the area of the heat transfer gap 28, which further increases the thermal path resistance. The length L of the diminished diameter portion 40 is selected such that there is a full diameter section 42 at least at the spring end of the thermal conduction element 26a so that it is properly maintained within its opening 20. The thermal conductive elements 26a having the diminished diameter portion 40 are shown in FIG. 1 as elements 26a and are associated with low-power chips identified as 10a. The resistance path for one of the higher power chips 10 is across the junction or interface gap 28 into a solid thermal conduction element 26. The heat then transfers across the peripheral gap 30 between the thermal conduction element 26 and the housing 16 where it transfers through the housing 16 across the gap 44 between the cold plate 38 and the housing 16 and through the cold plate wall into the fluid flowing through the cold plate 38 such as water. The helium 32 provides good thermal conduction across the gaps and thus, a highly efficient heat transfer path is provided. This is fine for the higher-power electronic components or chips 10 to be cooled. However, for the lower-power chips 10a this cooling path is much too efficient. Since the heat is removed with relative ease, the operating temperature in some instances is never reached. In some cases, the warm-up time to reach operating temperature is excessive. Accordingly, some way of making the heat transfer path for low-power chips less efficient is needed. The diminishing of the diameter of a portion of the thermal conduction element 26a in the heat path of the low-power chips 10a, increases the resistance of the heat path and, if properly designed, will maintain the low-power chip 10a at an operating temperature above the minimum operating temperature limits. It will be appreciated, that the diminished diameter creates a larger gap 30 between the thermal conduction element 26a and the wall of the housing 16, thus increasing the resistance of the gap. Thus, diminishing the diameter the required amount and making the length of the diminished diameter the required length, the desired increase in resistance can be obtained theoretically or preferably by actual fabricating and measuring.

Figure 2:
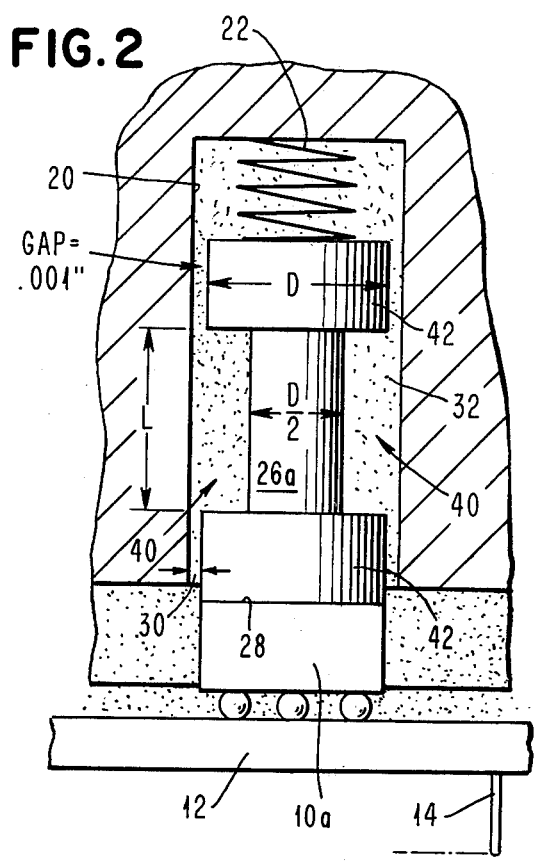
FIG. 2 is a cross-sectional view of a customized thermal conduction element located in the cooling path of a low-power electronic component to be cooled.

FIG. 2 shows a schematic cross-sectional, blown-up view of a customized thermal conduction element 26a for use with low-power chips 10a. The diameter D shown across the end portions 42 thereof is 0.214 inches, while the overall length of the element 26a is 0.625 inches. The gap between the end portions 42 of the thermal conduction element and the housing is equal to 0.001 inch. The length of the cutout or diminished diameter portion 40 is identified by L and the diameter of the remaining portion of the thermal conduction element after the diameter has been diminished is equal to D/2. Utilizing these fixed parameters the curve of the thermal characteristics of the thermal conduction element is obtained by plotting the total resistance of the gap 30 or anulus in degrees Centigrade per watt vs. the length of the cutout portion in inches. It will be appreciated that as the length L of the diminished diameter portion 40 increases, the total resistance of the gaps 30 between the thermal conduction element 26a and the housing 16 increases until the length L of the diminished diameter portion 40 equals 0.50 inches where even the smallest increase in length of the diminished diameter portion has a drastic increase in total resistance added to the thermal path. It will be appreciated, that increasing the resistance of the thermal interface 30 between the thermal conduction element 26a and the housing 16 will increase the thermal resistance of the cooling path which will result in the chip 10a being operable at a higher temperature in accordance with the increase in thermal path resistance. This will also enable the chip to reach its increased operating temperature faster, thus, cutting down on any long warm-up period for the low-power chips.

Figure 3:
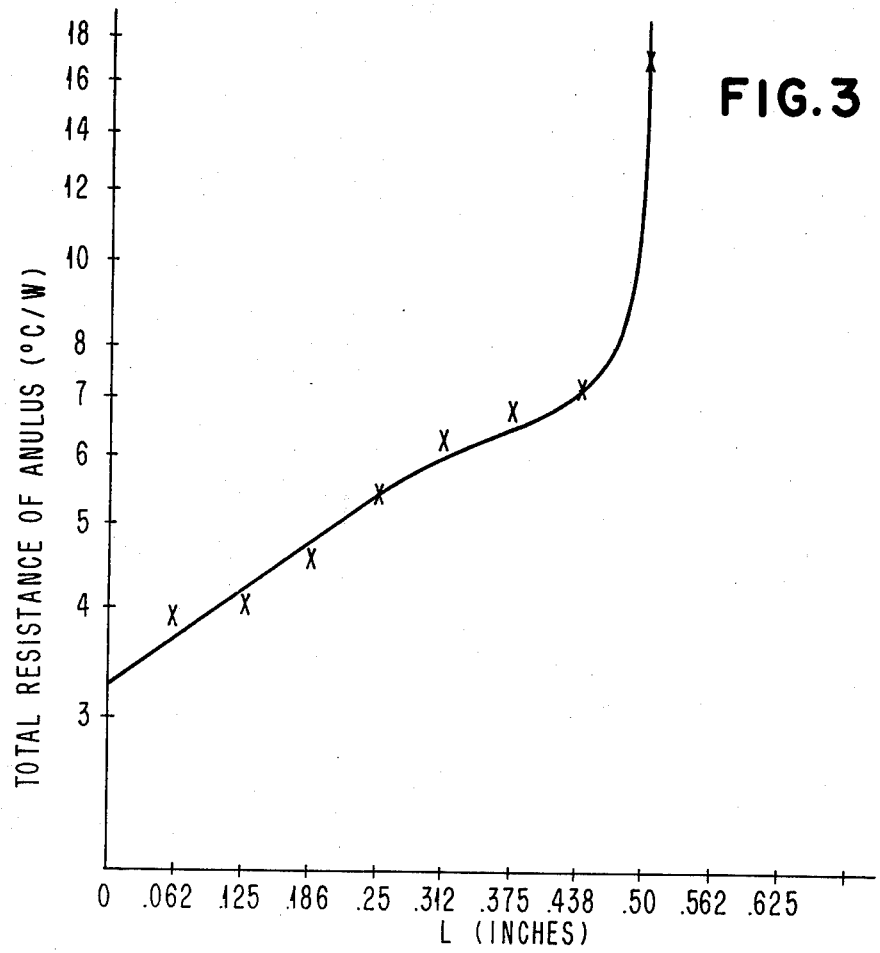
FIG. 3 is a graph of total resistance of the diminished diameter portion of the thermal conductive elements vs. the length of the diminished diameter portion.

Copper thermal conduction elements 26a were used to obtain the graph of FIG. 3. However, aluminum or other good thermal conductors could be used and the interface gaps 30 adjusted accordingly. Of course, all customized thermal conduction elements could be used in modules where all of the chips to be cooled are low-power chips.

While the invention has been particularly shown and described with reference to the preferred embodiment thereof, it will be understood by those skilled in the art that the various changes in form and detail may be made therein without departing from the spirit and scope of the invention.

What is claimed is:

1. In a conduction cooling module of the type having a conduction heat transfer path for removing heat from electronic components to be cooled, at least one low-power electronic component to be cooled within said module;
   a housing member included in the heat transfer path;
   said housing member having openings therein, one opposite each of the electronic components to be cooled;
   a thermal conduction element located in each of said housing member openings defining a gap between said thermal conduction element and said housing member;
   a predetermined diminished diameter portion of a predetermined length extending intermediate full diameter end portions of said thermal conduction elements located in said housing member opening located opposite said low-power electronic components thereby increasing the gap between said thermal conduction elements and said housing member which increases the thermal resistance of the path for the low-power electronic components; and
   resilient means urging said thermal conduction elements against the electronic components to be cooled to form a heat transfer interface therebetween.

2. In a conduction cooling module according to claim 1, wherein said predetermined diminished diameter portion of a predetermined length extending intermediate full diameter end portions of said thermal conduction element is symmetrical about the center of the length of said thermal conduction element thereby leaving full diameter end portions of equal lengths.

3. In a conduction cooling module according to claim 1, wherein said increased heat transfer gap includes a heat transfer medium to provide heat transfer thereacross by conduction.

4. In a conduction cooling module according to claim 3, wherein said increased heat transfer gap includes thermal conductive inert gas to provide heat transfer thereacross by conduction.

5. In a conduction cooling module according to claim 4, wherein said thermal conductive inert gas is helium.

6. In a conduction cooling module according to claim 1, wherein said thermal conduction element is made of copper.

* * * * *